United States Patent
Evans et al.

(10) Patent No.: US 7,492,562 B2
(45) Date of Patent: Feb. 17, 2009

(54) AFCI TEMPERATURE COMPENSATED CURRENT SENSOR

(75) Inventors: Tery John Evans, Bufford, GA (US); Elton C. Johnson, Decatur, GA (US); Carlos Restrepo, Atlanta, GA (US)

(73) Assignee: Siemens Energy & Automation, Inc., Alpharetta, GA (US)

(*) Notice: Subject to any disclaimer, the term of this patent is extended or adjusted under 35 U.S.C. 154(b) by 0 days.

(21) Appl. No.: 10/659,202

(22) Filed: Sep. 10, 2003

(65) Prior Publication Data

US 2005/0052809 A1 Mar. 10, 2005

(51) Int. Cl.
H02H 5/04 (2006.01)
H02H 3/00 (2006.01)
(52) U.S. Cl. .................................. 361/103; 361/42
(58) Field of Classification Search .................. 361/103, 361/106, 42
See application file for complete search history.

(56) References Cited

U.S. PATENT DOCUMENTS

| 3,817,453 | A | * | 6/1974 | Pinckaers ................. 236/68 C |
| 4,264,960 | A |   | 4/1981 | Gurr |
| 4,347,575 | A |   | 8/1982 | Gurr |
| 4,348,668 | A |   | 9/1982 | Gurr |
| 4,419,665 | A |   | 12/1983 | Gurr |
| 4,419,666 | A |   | 12/1983 | Gurr |
| 4,419,667 | A |   | 12/1983 | Gurr |
| 4,631,625 | A |   | 12/1986 | Alexander |
| 4,996,646 | A |   | 2/1991 | Farrington |
| 5,042,307 | A | * | 8/1991 | Kato .......................... 73/708 |
| 5,159,519 | A |   | 10/1992 | Cassidy |
| 5,166,887 | A |   | 11/1992 | Farrington |
| 5,170,360 | A |   | 12/1992 | Porter |
| 5,172,329 | A |   | 12/1992 | Rahman |
| 5,185,705 | A |   | 2/1993 | Farrington |
| 5,307,230 | A |   | 4/1994 | MacKenzie |
| 5,325,315 | A |   | 6/1994 | Engel |
| 5,361,637 | A | * | 11/1994 | Judd et al. ..................... 73/766 |
| 5,420,740 | A |   | 5/1995 | MacKenzie |
| 5,432,455 | A |   | 7/1995 | Blades |
| 5,434,509 | A |   | 7/1995 | Blades |
| 5,459,630 | A |   | 10/1995 | MacKenzie |
| 5,475,371 | A | * | 12/1995 | Dunk et al. ................. 340/660 |
| 5,483,211 | A |   | 1/1996 | Carrodus |
| 5,510,945 | A |   | 4/1996 | Taylor |
| 5,629,869 | A |   | 5/1997 | Johnson |
| 5,636,134 | A |   | 6/1997 | Johnson |
| 5,638,296 | A |   | 6/1997 | Johnson |
| 5,691,869 | A |   | 11/1997 | Engel |

(Continued)

FOREIGN PATENT DOCUMENTS

EP 1322016 6/2003

(Continued)

*Primary Examiner*—Ronald W Leja

(57) ABSTRACT

An apparatus and method for thermally compensating a voltage signal for a circuit protection device. The circuit protection device is coupled to a powered circuit and having current flowing through it. A bus carries the power therethrough. A sense resistor is electrically coupled to a bus for sensing the current flowing through the bus. A temperature sensitive circuit is coupled to the sense resistor for compensating ambient temperatures. The invention is useful for providing an accurate sense resistor that supplies a temperature independent current in a power line and the related voltage output of the sense resistor at varying ambient temperatures.

42 Claims, 5 Drawing Sheets

U.S. PATENT DOCUMENTS

| | | | |
|---|---|---|---|
| 5,744,939 A * | 4/1998 | Leppo | 320/153 |
| 5,796,636 A | 8/1998 | Andrews | |
| 5,805,397 A | 9/1998 | MacKenzie | |
| 5,815,352 A | 9/1998 | MacKenzie | |
| 5,818,237 A | 10/1998 | Zuercher | |
| 5,835,321 A | 11/1998 | Elms | |
| 5,839,092 A | 11/1998 | Erger | |
| 5,896,262 A | 4/1999 | Rae | |
| 5,929,145 A | 7/1999 | Higgins | |
| 5,933,305 A | 8/1999 | Schmalz | |
| 5,940,256 A | 8/1999 | MacKenzie | |
| 5,963,405 A | 10/1999 | Engel | |
| 5,963,406 A | 10/1999 | Neiger | |
| 5,969,920 A | 10/1999 | MacKenzie | |
| 5,999,384 A | 12/1999 | Chen | |
| 6,031,699 A | 2/2000 | Dollar | |
| 6,052,046 A | 4/2000 | Ennis | |
| 6,084,756 A | 7/2000 | Doring | |
| 6,088,205 A | 7/2000 | Neiger | |
| 6,128,169 A | 10/2000 | Neiger | |
| 6,150,714 A * | 11/2000 | Andreycak et al. | 257/690 |
| 6,191,589 B1 | 2/2001 | Clunn | |
| 6,218,844 B1 | 4/2001 | Wong | |
| 6,259,340 B1 | 7/2001 | Fuhr | |
| 6,259,996 B1 | 7/2001 | Haun | |
| 6,262,871 B1 | 7/2001 | Nemir | |
| 6,266,219 B1 | 7/2001 | Macbeth | |
| 6,289,267 B1 | 9/2001 | Alexander | |
| 6,292,717 B1 | 9/2001 | Alexander | |
| 6,339,525 B1 | 1/2002 | Neiger | |
| 6,356,426 B1 | 3/2002 | Dougherty | |
| 6,362,628 B2 | 3/2002 | Macbeth | |
| 6,370,001 B1 | 4/2002 | Macbeth | |
| 6,377,427 B1 | 4/2002 | Haun | |
| 6,407,893 B1 | 6/2002 | Neiger | |
| 6,414,829 B1 | 7/2002 | Haun | |
| 6,417,671 B1 | 7/2002 | Tiemann | |
| 6,421,214 B1 | 7/2002 | Packard | |
| 6,426,632 B1 | 7/2002 | Clunn | |
| 6,426,634 B1 | 7/2002 | Clunn | |
| 6,433,978 B1 | 8/2002 | Neiger | |
| 6,456,471 B1 | 9/2002 | Haun | |
| 6,459,273 B1 | 10/2002 | Dollar | |
| 6,466,029 B2 | 10/2002 | Stroth | |
| 6,477,021 B1 | 11/2002 | Haun | |
| 6,487,057 B1 | 11/2002 | Natili | |
| 6,496,342 B1 | 12/2002 | Horvath | |
| 6,504,692 B1 | 1/2003 | Macbeth | |
| 6,522,510 B1 | 2/2003 | Finlay | |
| 6,525,918 B1 | 2/2003 | Alles | |
| 6,532,139 B2 | 3/2003 | Kim | |
| 6,532,140 B1 | 3/2003 | McMahon | |
| 6,532,424 B1 | 3/2003 | Haun | |
| 6,542,056 B2 | 4/2003 | Nerstrom | |
| 6,556,397 B2 | 4/2003 | Kim | |
| 6,567,250 B1 | 5/2003 | Haun | |
| 6,577,478 B2 | 6/2003 | Kim | |
| 6,577,484 B1 | 6/2003 | Macbeth | |
| 6,590,754 B1 | 7/2003 | Macbeth | |
| 6,608,741 B1 | 8/2003 | Macbeth | |
| 6,621,388 B1 | 9/2003 | Macbeth | |
| 6,621,669 B1 | 9/2003 | Haun | |
| 6,625,550 B1 | 9/2003 | Scott | |
| 6,628,486 B1 | 9/2003 | Macbeth | |
| 6,628,487 B1 | 9/2003 | Macbeth | |
| 6,633,467 B2 | 10/2003 | Macbeth | |
| 6,633,824 B2 | 10/2003 | Dollar | |
| 6,639,768 B2 | 10/2003 | Zuercher | |
| 6,639,769 B2 | 10/2003 | Neiger | |
| 6,654,219 B1 | 11/2003 | Romano | |
| 6,657,837 B1 | 12/2003 | Morris | |
| 6,667,691 B2 | 12/2003 | Sapir | |
| 6,671,148 B2 | 12/2003 | Evans | |
| 6,671,150 B2 | 12/2003 | Elms | |
| 6,678,137 B1 * | 1/2004 | Mason et al. | 361/103 |
| 6,707,651 B2 | 3/2004 | Elms | |
| 6,731,483 B2 | 5/2004 | Mason | |
| 6,734,682 B2 | 5/2004 | Tallman | |
| 6,812,677 B2 * | 11/2004 | Walters et al. | 323/277 |
| 6,813,131 B2 * | 11/2004 | Schmalz | 361/105 |
| 6,856,498 B1 | 2/2005 | Finlay | |
| 6,992,872 B2 | 1/2006 | Morris | |
| 7,023,196 B2 | 4/2006 | Khan | |
| 7,035,066 B2 | 4/2006 | McMahon | |
| 7,110,864 B2 | 9/2006 | Restrepo | |
| 7,307,820 B2 | 12/2007 | Henson | |
| 7,359,168 B2 | 4/2008 | Elms | |
| 2002/0012210 A1 | 1/2002 | Morris | |
| 2002/0032535 A1 | 3/2002 | Alexander | |
| 2002/0033701 A1 | 3/2002 | Macbeth | |
| 2002/0075613 A1 * | 6/2002 | Mason et al. | 361/42 |
| 2002/0097095 A1 * | 7/2002 | Jeon et al. | 330/289 |
| 2003/0067725 A1 | 4/2003 | Horvath | |
| 2003/0072113 A1 | 4/2003 | Wong | |
| 2004/0070495 A1 * | 4/2004 | Chu et al. | 340/501 |
| 2004/0070898 A1 | 4/2004 | McMahon | |
| 2005/0203672 A1 | 9/2005 | Restrepo | |
| 2006/0274460 A1 | 12/2006 | Zuercher | |
| 2007/0014060 A1 | 1/2007 | Land | |
| 2007/0081281 A1 | 4/2007 | Hamer | |
| 2007/0208981 A1 | 9/2007 | Restrepo | |

FOREIGN PATENT DOCUMENTS

| | | |
|---|---|---|
| EP | 1429437 | 6/2004 |

\* cited by examiner

AFCI TEMPERATURE COMPENSATED CURRENT SENSOR

FIELD OF INVENTION

The present invention relates to an apparatus and method for sensing and translating a current signal into a temperature compensated voltage signal used by an Arc Fault Circuit Interrupter (AFCI) detection circuit

BACKGROUND

In general, several different types of sensing apparatus have been used to measure current in an electrical circuit. Such sensing apparatus may utilize sense resistors, current transformers, and Hall Effect sensors. These sensors are used to monitor and measure current as it passes through the load of a circuit either for purposes of overcurrent protection or to control another circuit based on the measured current in the load.

Sensors are also used to detect wave forms and the shape of current which can indicate the presence of an arc fault. Arcing faults may be defined as the existence of a current path between two ends of a broken conductor located within an ionized gas, between two conductors supplying a load, or between a conductor and a ground. Arcing faults are characterized by low and erratic current flow. Arcing faults may be undetected by standard circuit breakers, because the current flow may be below the breaker's tripping threshold. Upon occurrence of an arcing fault, branch or load impedance may cause the current levels to be reduced to a level below the trip curve setting of the circuit breaker, causing the arcing fault condition to be undetected by a circuit breaker. In addition, an arcing fault which does not contact a grounded conductor or other grounded point will not trip a ground fault protected circuit.

During the current measurement, it is important to maintain galvanic isolation in order to assure that current does not flow directly between the load and the measuring circuit. Sense resistors, typically, are accurate, inexpensive, and provide a higher frequency response than the other two types of sensors mentioned above. However, a disadvantage of the sense resistors is that they provide no galvanic isolation. Another disadvantage is that the sensor output signal tends to vary with temperature variations. This is due to the composition of the sensing material used. Metals have an inherent property of changing resistance when ambient temperatures fluctuate. By way of example, the proportionality of a signal being converted at 25 degrees Celsius will be different from the same signal being converted at 66 degrees Celsius or −35 degrees Celsius. Similarly, the sensitivity of the circuit changes if there is a deviation from a nominal operational temperature of 25 degrees Celsius. Known sense resistor configurations do not compensate the current for this variance in ambient temperature. Therefore, a need exists to compensate for temperature induced signal drift.

On the other hand, both current transformers and Hall Effect sensors provide galvanic isolation. Current transformers also provide proportional signals with suitable accuracy at a wide operational temperature range. However, both current transformers and Hall Effect sensors are more expensive solutions. Further, the frequency content for current transformer and Hall Effect sensors will be lost or will be filtered out because they have a low pass filter type transfer function. A disadvantage of a low pass filter type transfer function is that the critical information of the frequency content provided at higher frequencies will be missed. A further disadvantage of current transformers is that they occupy a relatively large area of a printed circuit board.

SUMMARY OF INVENTION

It is therefore an object of the present invention to provide an improved sense resistor apparatus for supplying a valid current signal to an arc fault circuit interrupter detection circuit at varying ambient temperatures.

It is also an object of the present invention to provide an improved sense resistor that is inexpensive, accurate, responds at high frequencies, and imparts galvanic isolation at varying ambient temperatures.

In accordance with one aspect of this invention, a temperature compensated current sensor for a circuit protection apparatus comprises: a circuit protection device for coupling to a powered circuit having current flowing therein; a bus for carrying the power therethrough; a sensing resistor electrically coupled to the bus for sensing current flow through the bus; temperature sensitive compensation circuit coupled to the sense resistor for compensating ambient temperature; and an output for reading the current.

In accordance with another aspect of this invention, a sense resistor apparatus for providing a temperature independent current signal at varying ambient temperatures, comprises: a sense resistor for sensing a current passed through the sense resistor and generating a voltage signal; and at least one thermistor for thermally compensating the voltage signal generated through the sense resistor.

In accordance with another aspect of this invention an apparatus for thermally compensating a voltage signal for an AFCI circuit, comprises: a sense resistor for sensing a current passed through the sense resistor and generating the voltage signal; at least one thermistor for thermally compensating the voltage signal generated through the sense resistor; and an operational amplifier for conditioning a thermally compensated voltage signal before the thermally compensated voltage signal enters a detection circuit of an arc fault circuit interrupter device.

In accordance with another aspect of this invention, a method for translating a current signal into a temperature compensated voltage signal for an AFCI circuit, comprise: generating a voltage signal by passing the current signal through a sense resistor; applying the voltage signal through at least one thermistor to generate a thermally proportional voltage signal; amplifying the thermally proportional voltage signal by energizing an operational amplification circuit; and determining whether a detection circuit of an arc fault circuit interrupter device detects the thermally proportional voltage signal.

In accordance with another aspect of this invention, a method for thermally compensating a voltage signal, comprises generating the voltage signal by passing a current signal through a sense resistor; and applying the voltage signal through at least one thermistor to generate a thermally proportional voltage signal.

In accordance with another aspect of this invention, a method for thermally compensating a current sensor for a circuit protection apparatus comprises coupling a circuit protection device to a powered circuit having current flowing therein; coupling a bus for carrying the power therethrough; electrically coupling a sensing resistor to the bus for sensing current flow through the bus; coupling a temperature sensitive compensation circuit to the sense resistor for compensating ambient temperature; and reading an output of the current.

DETAILED DESCRIPTION

Figure 1A:
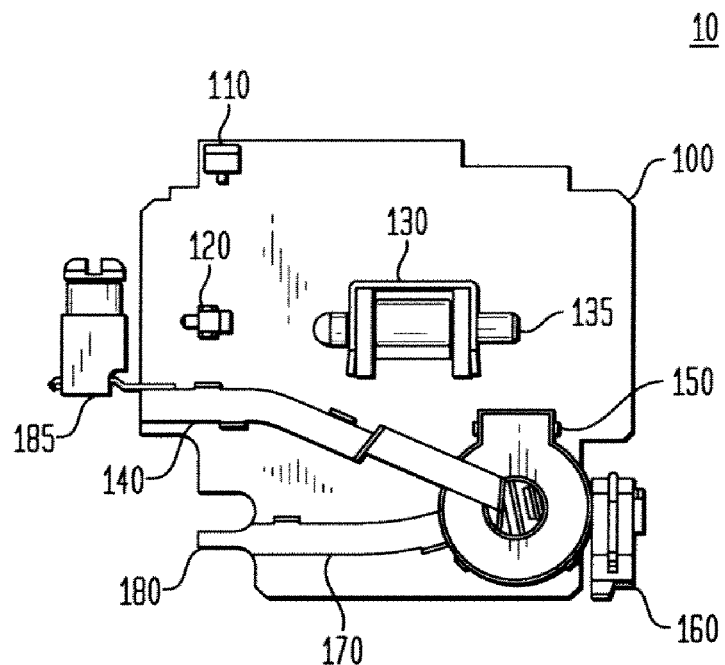
FIG. 1a) is a side view of the sense resistor incorporated into a powered circuit.

FIG. 1a) refers to the components incorporated in a powered circuit 10 comprising a printed circuit board 100 comprising push to test switches 110, power clip 120, solenoid 130, part of neutral trace 140, differential sensor 150, line terminal 160, sense resistor 170, neutral pigtail 180, neutral lug 185, and contact 190. Power clip 120 connects printed circuit board 100 to a voltage source.

Current is sensed when a proportional voltage signal is generated by the passage of current through the sense resistor 170. By switching on a load, a current is first sent through the partial of neutral trace 140 to the differential sensor 150. The differential sensor 150 is used to detect hot to neutral situational arcs to safeguard ground wire devices. Solenoid 130 comprises a plunger 135 that extends upon reaction and detection of a hot to neutral situational arc by differential sensor 150. From the differential sensor 150, the current flows to the sense resistor 170 and then out through neutral pigtail 180 which is crimped to the neutral boss on a load center to complete the circuit and path of current with load center. The neutral pigtail 180 may also be used to attach a circuit breaker, such as an Application Specific Integrated Circuit (ASIC) detection circuit of an arc fault interrupter device. The sense resistor 170 is part of the current path of the ASIC detection circuit of an arc fault circuit interrupter device.

Figure 1B:
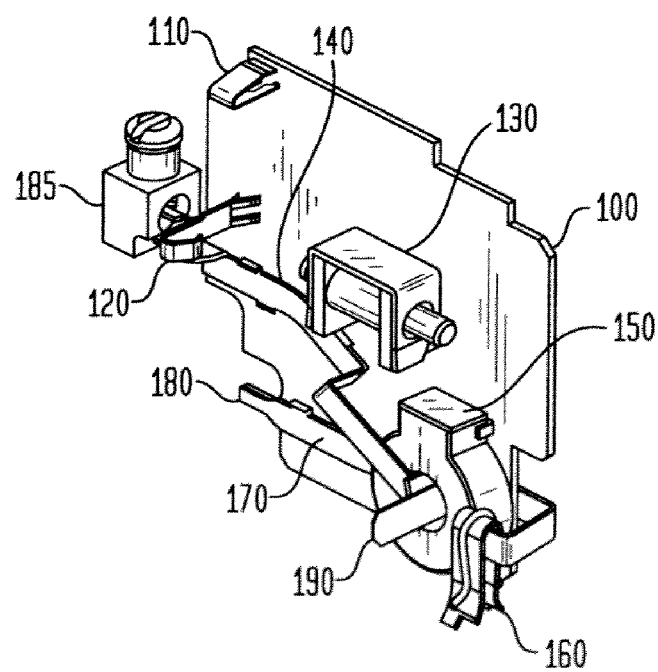
FIG. 1b) is a perspective view of the sense resistor incorporated into a powered circuit.
Figure 2A:
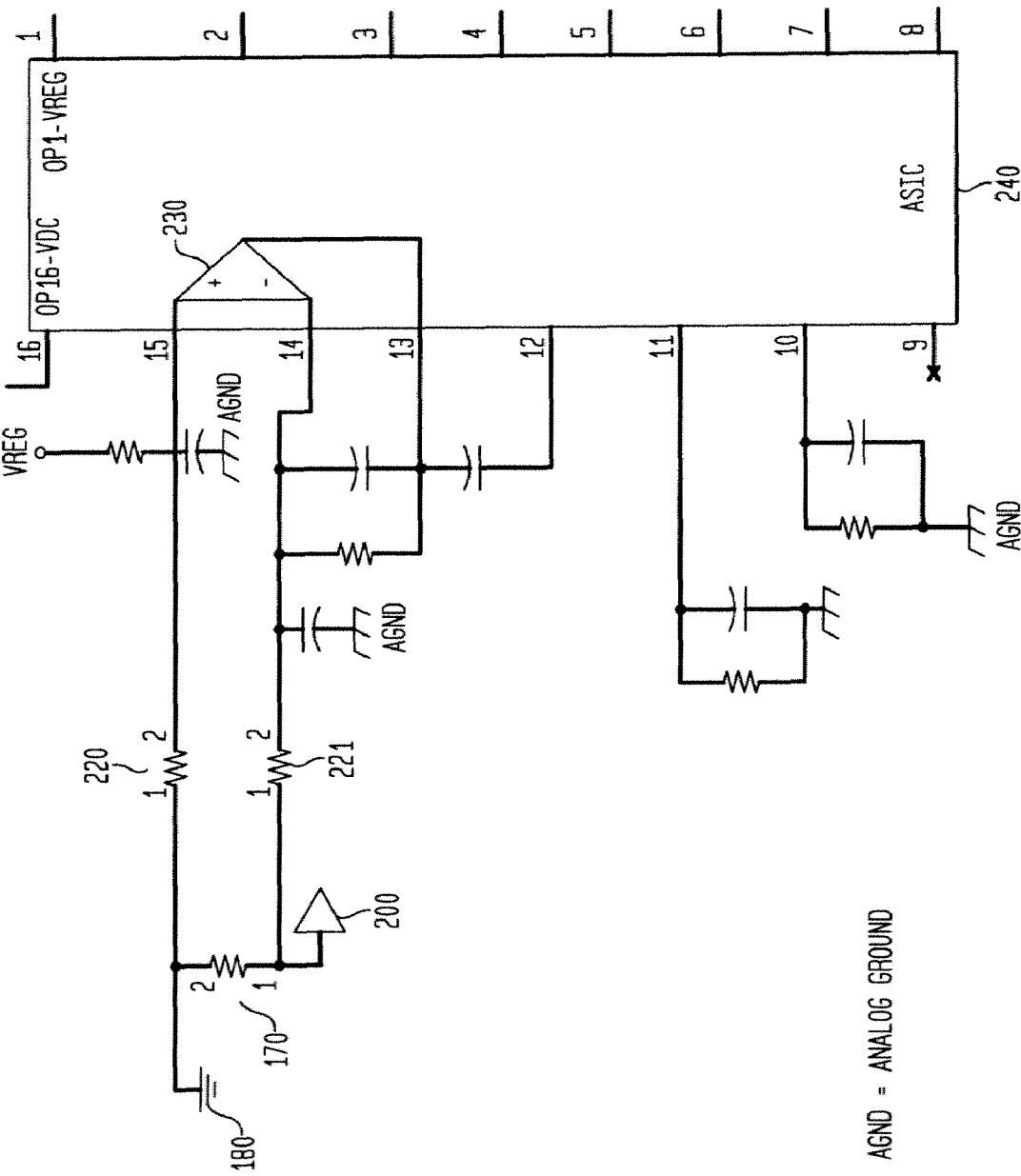
FIG. 2 is a schematic circuit diagram of the sense resistor with a Positive Temperature Coefficient (PTC) thermistor configuration

Referring to FIGS. 1a and 1b in conjunction with FIG. 2, first 220 and second 221 Positive Temperature Coefficient (PTC) thermistors are connected to pins 14 and 15, respectively of ASIC detection circuit 240. A PTC thermistor 220 is a thermally sensitive semiconductor resistor that is well known in the art whose primary function is to exhibit a change in electrical resistance with a change in body temperature. One ordinarily skilled in the art may use a PTC thermistor 220 constructed from ceramic materials and linear in nature. A nominal PTC thermistor 220 measures 10 k Ohm of resistance at 25 degrees Celsius. Change in the resistance of a PTC thermistor 220 can be brought about either by a change in the ambient temperature or internally by self heating resulting from current flowing through the device. At room temperature, the resistance of PTC thermistor 220 is almost zero. Sense resistor 170 is connected between the first 220 and second 221 PTC thermistors. Line terminal 160 serves to connect a stab assembly used in the load center to the differential sensor 150.

In accordance with the present invention, the resistance value of the sense resistor is selected such that the voltage generated will be sufficiently large enough to be used by the ASIC detection circuit 240 and small enough to not apply detrimental electric voltage. By way of example, the resistance value may be approximately 250 micro Ohms, although it is understood that other suitable resistance values may be selected.

Figure 2B:
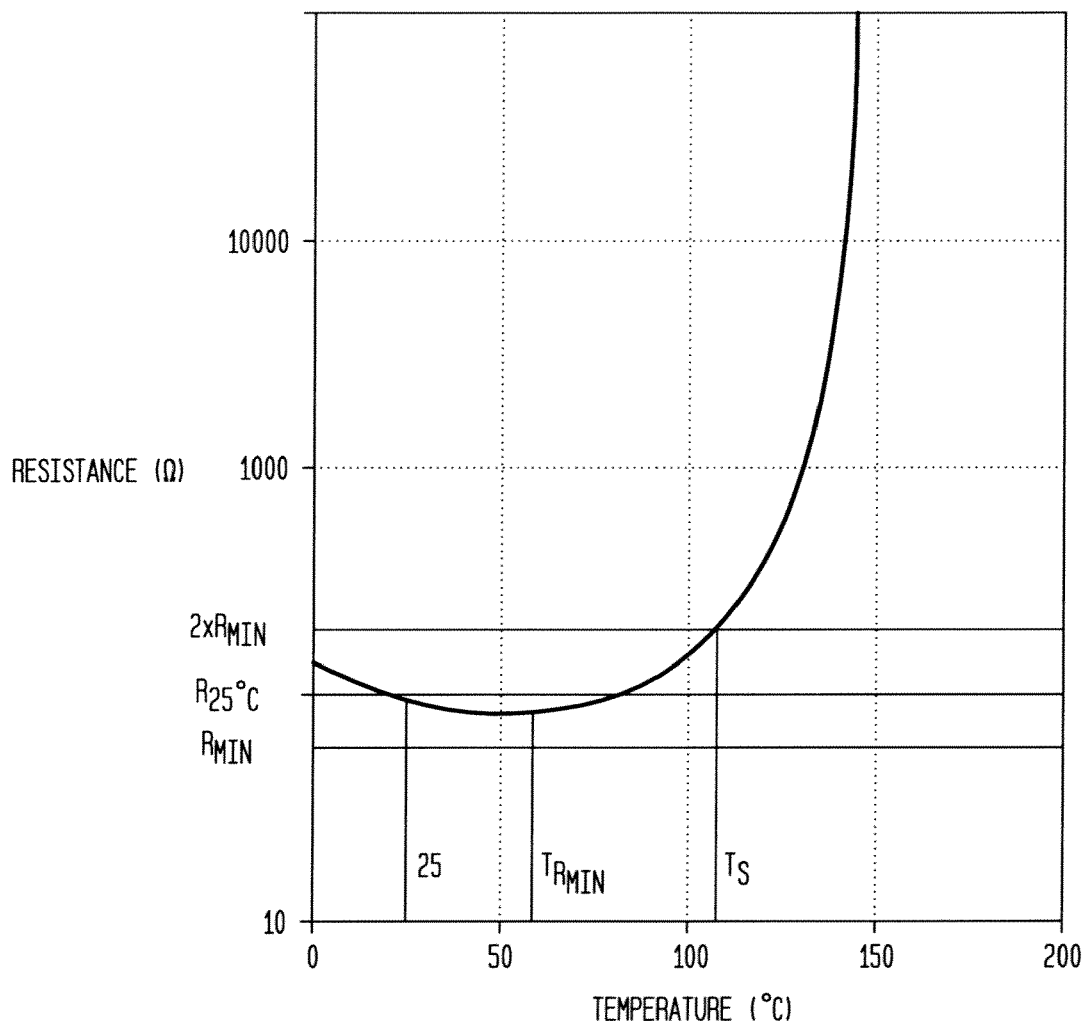

Referring to FIG. 2, the preferred embodiment, the current flows from load neutral 200 through the sense resistor 170 (point 1 to point 2) and then to the neutral pigtail 180 (also considered earth). Voltage is produced as the current flows through the sense resistor 170. This voltage potential is attenuated by the first 220 and the second 221 PTC thermistor. In the case of an overcurrent situation, resistance rises within the first 220 and the second 221 PTC thermistor. This additional resistance in the circuit has the effect of reducing the overall current. Once the overcurrent situation has been removed, the first 220 and the second 221 PTC thermistor will cool, in doing so their internal temperature drops resulting in the resistance returning to a low state. The first 220 and the second 221 PTC thermistor can be formulated to have switching temperatures as low as 0 degrees Celsius to well over 200 Celsius. The ambient temperature will force the first 220 and the second 221 PTC thermistor's resistive properties to change. If the ambient temperatures are above 25 degrees Celsius, then the resistive properties of the first 220 and the second 221 PTC thermistor will increase automatically as the first 220 and the second 221 PTC thermistor are passive electrical devices. Alternatively, if the ambient temperature is below 25 degrees C., then the resistive properties of the first 220 and the second 221 PTC thermistor will decrease to a low state. See the chart in FIG. 2B.

Therefore, the first 220 and the second 221 PTC thermistor is directly proportional to temperature and has a different resistance value based on different ambient temperatures. The first 220 and the second 221 PTC thermistor dynamically compensates the voltage signal proportion to the changes in resistance of the metal in the first 220 and the second 221 PTC thermistor due to the exposure to ambient temperatures above and below and below 25 degrees Celsius. As the ambient temperature increases, then the resistive properties of the first 220 and the second 221 PTC thermistor will also increase. Also, if the ambient temperature increases, the voltage signal generated from the sense resistor 170 will increase. Prior to the voltage signal entering the ASIC detection circuit 240 of the AFCI device, the first 220 and the second 221 PTC thermistor will compensate for this change in voltage signal the following way:

$$V_{OUTPUT} = V_{INPUT} \times (R_{FIXED}/R_{PTC})$$

$V_{OUTPUT}$ is the thermally compensated voltage output. $R_{PTC}$ is the resistance of the first 220 and the second 221 PTC thermistor at the specific ambient temperature. $R_{FIXED}$ is the resistance of an off the shelf resistor that has a constant resistance value at a 25 degree Celsius ambient temperature nominally valued at 300 k Ohms. $V_{INPUT}$ is the voltage generated as current passes through the sense resistor 170 at ambient temperatures. The thermally compensated voltage signal is equal to the ratio of the resistance of a first 220 and a second 221 PTC thermistor at 25 degrees Celsius divided by the resistance of a first 220 and a second 221 PTC thermistor at the ambient temperature as applied to the voltage signal generated by the sense resistor 170 at ambient temperatures. Therefore, the change in temperature for the voltage output is linearly inverse to that of the sense resistor 170 in order to mitigate any effects due to temperature change.

Once the voltage signal is attenuated, the output is then passed through an operational amplifier 230 for final conditioning. The operational amplifier 230, located inside the ASIC circuit 240, connects in a negative feedback configuration whereby there is high impedance and therefore negligible current. This negative feedback configuration allows the amplification of the voltage signal. The operational amplifier 230 is powered by 1016 VDC which is a 10 V DC source feeding the ASIC circuitry 240 and the ASIC circuitry 240 regulates the voltage signal to all the internal components. The output of the operational amplifier 230 is sent back to lead 13. The amplification occurs because the voltage signal coming from the sense resistor 170 is a low voltage value and requires a higher voltage value for detection by the ASIC circuit 240. The ASIC circuit 240 is responsible for detecting the arc. The ASIC circuit 240 is assigned to pick up the particular singularities or features of the current waveform sensed by the sense resistor 170. The only way to observe an arc fault is if there is a current flowing through the powered AC line.

Figure 3:
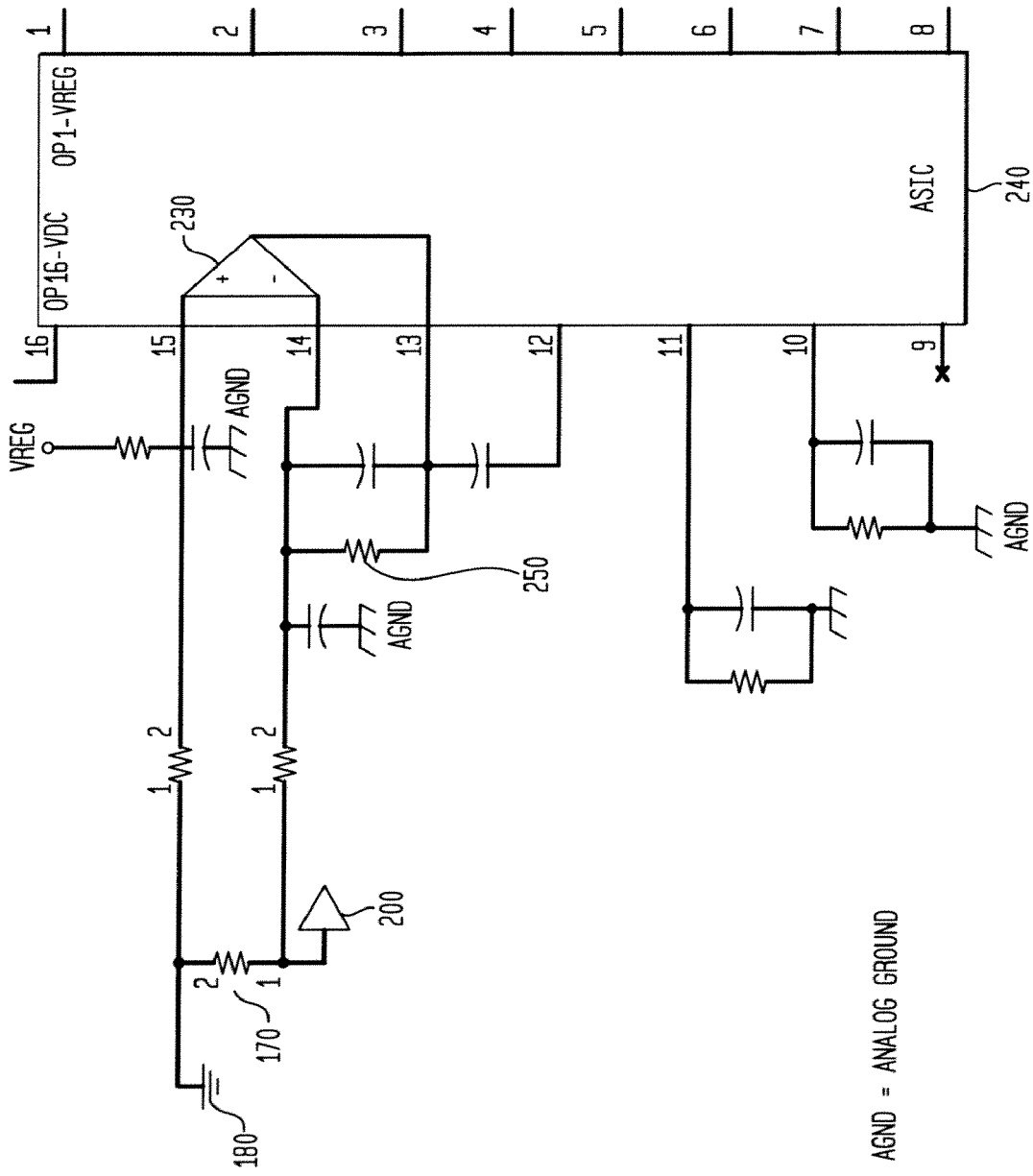
FIG. 3 is a schematic circuit diagram of the sense resistor with a Negative Temperature Coefficient (NTC) thermistor configuration

FIG. 3 shows another embodiment using one NTC thermistor 250 in contrast to the first 220 and the second 221 PTC thermistor. The NTC thermistor 250 would replace a negative feedback resistor with the condition that the operational amplifier 230 does not saturate. The Negative Temperature Coefficient (NTC) thermistor 250 is a thermistor whose zero-power resistance decreases with an increase in temperature. Therefore, a NTC thermistor 250 is inversely proportional to temperature increase and will compensate the voltage signal as follows:

$$V_{OUTPUT} = V_{INPUT} \times (R_{NTC}/R_{FIXED})$$

where the value of the thermally compensated voltage signal is equal to the ratio of the resistance of the NTC thermistor 250 at the ambient temperature divided by the resistance of the NTC thermistor 250 at a normal 25 degrees Celsius ambient temperature applied to the voltage generated through the sense resistor 170. $V_{OUTPUT}$ is the thermally compensated voltage output. $R_{NTC}$ is the resistance of the NTC thermistor at the specific ambient temperature. $R_{FIXED}$ is the resistance of an off the shelf resistor that has a constant resistance value at a 25 degree Celsius ambient temperature. $V_{INPUT}$ is the voltage generated as current passes through the sense resistor 170 at ambient temperatures.

Figure 4:
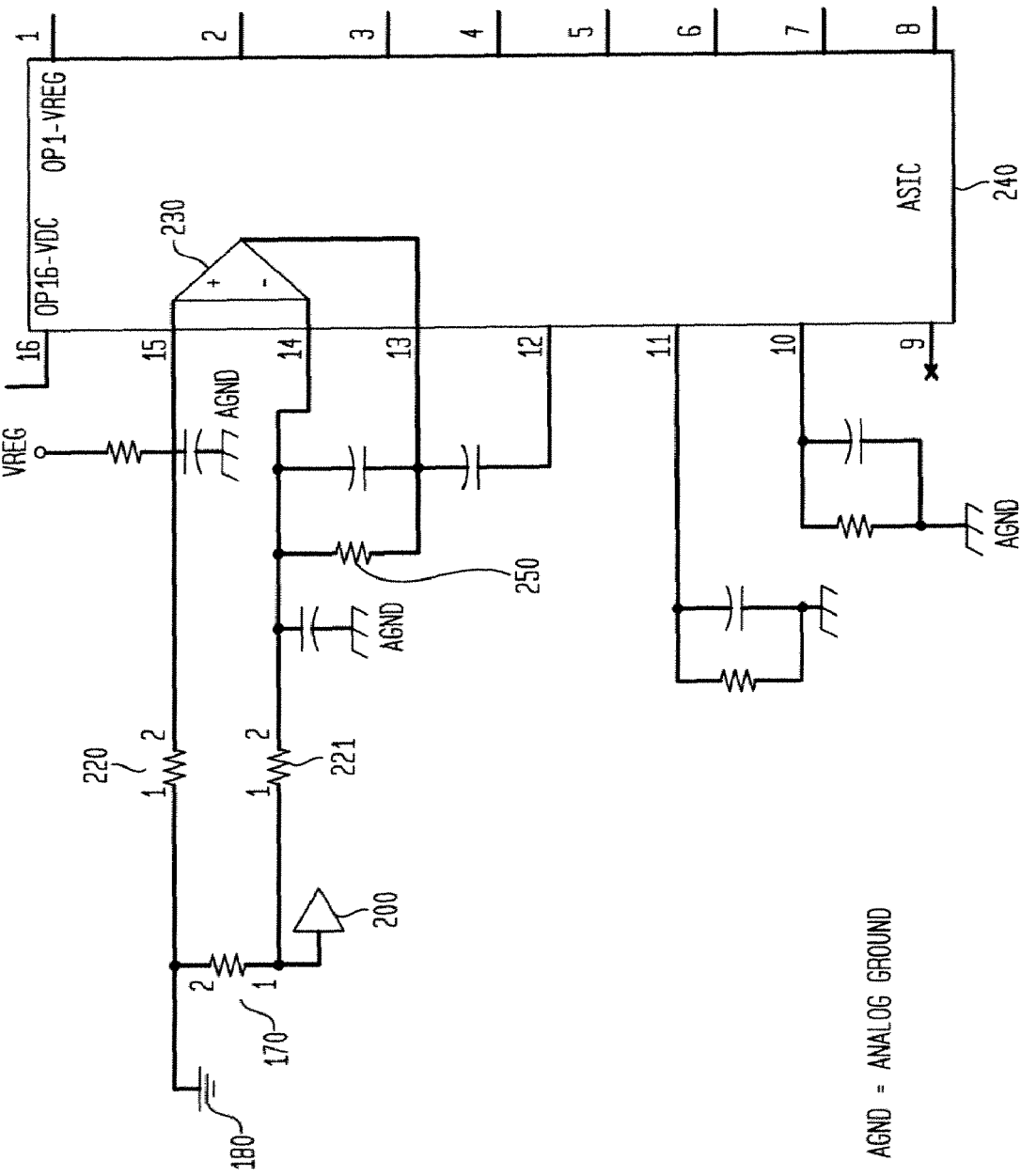
FIG. 4 is a schematic circuit diagram of the sense resistor with a Positive Temperature Coefficient (PTC) thermistor configuration & Negative Temperature Coefficient (NTC) thermistor configuration

FIG. 4 shows another embodiment using the configuration two PTC thermistors 220 and one NTC thermistor 250 simultaneously. In this embodiment, the sense resistor 170 will be able to measure the more dramatic changes in the electrical system due to varying ambient temperatures. There are situations where the first 220 and the second 221 PTC thermistor do not provide adequate compensation for the AC current in the power line and the voltage output of the sense resistor 170 at varying ambient temperatures. In this embodiment, the configuration of the first 220 and the second 221 PTC thermistor and the NTC thermistor 250 in combination with the sense resistor 170 allows for additional compensability.

While the present invention has been disclosed with reference to certain embodiments, numerous modifications, alterations, and changes to the described embodiment are possible without departing from the sphere and scope of the present invention. Accordingly, it is intended that the present invention not be limited to the described embodiments and equivalents thereof.

The invention claimed is:

1. A temperature compensated current sensor for a circuit protection apparatus comprising:
a circuit protection device adapted to be operatively coupled to a powered circuit having current flowing therein;
a bus adapted to carry power therethrough;
a sensing resistor electrically coupled to the bus, the sensing resistor comprising a first end and an opposing second end, the sensing resistor adapted to provide a signal indicative of current flow through the bus;
temperature sensitive compensation circuit electrically coupled to the sensing resistor, the temperature sensitive compensation circuit comprising a first thermistor electrically coupled to the first end of the sensing resistor and a second thermistor electrically coupled to the second end of the sensing resistor, the temperature sensitive compensation circuit adapted to attenuate the signal indicative of current flow through the bus to a temperature compensated signal; and
an arc fault determination circuit adapted to determine an arc fault based upon the temperature compensated signal.

2. The apparatus of claim 1, wherein the arc fault determination circuit is an ASIC circuit.

3. The apparatus of claim 1, wherein the circuit protection device comprises an operational amplifier, the operational amplifier adapted to amplify the signal indicative of current flow through the bus or the temperature compensated signal.

4. The apparatus of claim 1, wherein the temperature sensitive compensation circuit comprises a third thermistor.

5. The apparatus of claim 4, wherein the first thermistor is positioned between the sensing resistor and the arc fault determination circuit.

6. The apparatus of claim 4, wherein the first thermistor is linear.

7. The apparatus of claim 4, wherein the first thermistor is ceramic.

8. The apparatus of claim 4, wherein the first thermistor is a PTC thermistor.

9. The apparatus of claim 4, wherein the third thermistor is a NTC thermistor.

10. A sense resistor apparatus for providing a temperature independent current signal at varying ambient temperatures, comprising:
a sense resistor adapted for sensing a current passed trough the sense resistor and adapted for generating a voltage signal, the sense resistor comprising a first end and an opposing second end the first end of the sense resistor electrically coupled to a load neutral, the second end of the sense resistor electrically coupled to a neutral pigtail;
at least one thermistor adapted for thermally compensating the voltage signal generated through the sense resistor; and
an arc fault determination circuit adapted to receive a temperature compensated voltage signal from the at least one thermistor, the circuit adapted provide a signal to trip a circuit breaker responsive to responsive to a determination of an arc fault by the circuit, the determination of the arc fault based upon the temperature compensated voltage signal.

11. The apparatus of claim 10, wherein the at least one thermistor is positioned between the sense resistor and the circuit.

12. The apparatus of claim 10, wherein the at least one thermistor is linear.

13. The apparatus of claim 10, wherein the at least one thermistor is ceramic.

14. The apparatus of claim 10, wherein the at least one thermistor is a PTC thermistor.

15. The apparatus of claim 10, wherein the at least one thermistor is a NTC thermistor.

16. An apparatus for thermally compensating a voltage signal for an AFCI circuit, comprising:

a sense resistor adapted for sensing a current passed through the sense resistor and generating the voltage signal, the sense resistor comprising a first end and an opposing second end, the first end of the sense resistor electrically coupled to a load neutral, the second end of the sense resistor electrically coupled to a neutral pigtail;

at least one thermistor adapted for thermally compensating the voltage signal generated through the sense resistor; and an operational amplifier adapted for conditioning a thermally compensated voltage signal before the thermally compensated voltage signal enters a detection circuit of an arc fault circuit interrupter device.

17. The apparatus of claim 16, wherein the detection circuit comprises an ASIC circuit.

18. The apparatus of claim 16, wherein the at least one thermistor is positioned between the sense resistor and an ASIC circuit.

19. The apparatus of claim 16, wherein the at least one thermistor is ceramic.

20. The apparatus of claim 16, wherein the at least one thermistor is linear.

21. The apparatus of claim 16, wherein the at least one thermistor is a PTC thermistor.

22. The apparatus of claim 16, wherein the at least one thermistor is a NTC thermistor.

23. A method for translating a current signal into a temperature compensated voltage signal for an AFCI circuit, comprising:

generating a voltage signal by passing the current signal through a sense resistor, the sense resistor comprising a first end and an opposing second end;

applying the voltage signal through a first thermistor electrically coupled to the first end of the sense resistor and a second thermistor electrically coupled to the second end of the sense resistor to generate a thermally proportional voltage signal;

amplifying the thermally proportional voltage signal by energizing an operational amplification circuit; and tripping a circuit breaker based upon a determined arc fault, the arc fault determined based upon the thermally proportional voltage signal.

24. The method of claim 23, wherein an ASIC circuit determines the arc fault.

25. The method of claim 23, wherein the first thermistor is positioned between the sense resistor and an ASIC circuit that determines the arc fault.

26. The method of claim 23, wherein the first thermistor is linear.

27. The method of claim 23, wherein the first thermistor is ceramic.

28. The method of claim 23, wherein the first thermistor is a PTC thermistor.

29. The method of claim 23, wherein the thermally proportional voltage signal is applied via a third thermistor that is a NTC thermistor.

30. A method for thermally compensating a voltage signal, comprising:

generating the voltage signal by passing a current signal through a sense resistor, the sense resistor comprising a first end and an opposing second end; and applying the voltage signal through a first thermistor electrically coupled to the first end of the sense resistor and a second thermistor electrically coupled to the second end of the sense resistor to generate a thermally proportional voltage signal, the voltage signal provided to an arc fault determination circuit adapted to determine an arc fault based upon the thermally proportional voltage signal, the circuit adapted to cause a circuit breaker to trip responsive to the arc fault.

31. The method of claim 30, wherein the first thermistor is linear.

32. The method of claim 30, wherein the first thermistor is a PTC thermistor.

33. The method of claim 30, wherein the thermally proportional voltage signal is applied via a third thermistor that is a NTC thermistor.

34. A method for thermally compensating a current sensor for a circuit protection apparatus comprising:

coupling a circuit protection device to a powered circuit having current flowing therein; coupling a bus adapted for carrying power therethrough;

electrically coupling a sensing resistor to the bus, the sensing resistor adapted for sensing current flow through the bus, the sensing resistor comprising a first end and an opposing second end;

coupling a temperature sensitive compensation circuit to the sensing resistor, the temperature sensitive compensation circuit comprising a first thermistor electrically coupled to the first end of the sensing resistor and a second thermistor electrically coupled to the second end of the sensing resistor, the temperature sensitive compensation circuit adapted for compensating ambient temperature; and coupling an arc fault determination circuit to the temperature sensitive compensation circuit, the arc fault determination circuit adapted to cause a circuit breaker to trip responsive to an arc fault determination, the arc fault determination based upon an output of the temperature sensitive compensation circuit.

35. The method of claim 34, wherein the arc fault determination circuit comprises an ASIC circuit.

36. The method of claim 34, wherein the arc fault determination circuit comprises an operational amplifier.

37. The method of claim 34, wherein the temperature sensitive compensation circuit comprises a third thermistor.

38. The method of claim 37, wherein the first thermistor is positioned between the sensing resistor and the arc fault determination circuit.

39. The method of claim 37, wherein the first thermistor is linear.

40. The method of claim 37, wherein the first thermistor is ceramic.

41. The method of claim 37, wherein the first thermistor is a PTC thermistor.

42. The method of claim 37, wherein one third thermistor is a NTC thermistor.

* * * * *